United States Patent
Peverini et al.

(10) Patent No.: US 11,921,432 B2
(45) Date of Patent: Mar. 5, 2024

(54) OPTICAL SYSTEM WITH VARIABLE FOCAL DISTANCE AND OPTICAL ASSEMBLY COMPRISING SUCH A SYSTEM

(71) Applicant: THALES, Courbevoie (FR)

(72) Inventors: Luca Peverini, Aix-en-Provence (FR); Stéphan Imperiali, Aix-en-Provence (FR); Remy Neviere, Aix-en-Provence (FR); Thibault Dufour, Aix-en-Provence (FR)

(73) Assignee: THALES, Courbevoie (FR)

( * ) Notice: Subject to any disclaimer, the term of this patent is extended or adjusted under 35 U.S.C. 154(b) by 497 days.

(21) Appl. No.: 17/319,970

(22) Filed: May 13, 2021

(65) Prior Publication Data

US 2021/0364933 A1 Nov. 25, 2021

(30) Foreign Application Priority Data

May 19, 2020 (FR) ..................................... 20 05024

(51) Int. Cl.
*G21K 5/00* (2006.01)
*G03F 7/00* (2006.01)
*G21K 1/06* (2006.01)

(52) U.S. Cl.
CPC ...... *G03F 7/70641* (2013.01); *G03F 7/70033* (2013.01); *G21K 1/067* (2013.01)

(58) Field of Classification Search
None
See application file for complete search history.

(56) References Cited

U.S. PATENT DOCUMENTS

| | | | |
|---|---|---|---|
| 2007/0025511 A1* | 2/2007 | Sherman | G21K 1/06 378/84 |
| 2007/0295817 A1* | 12/2007 | Massieu | G06K 7/10702 235/462.23 |
| 2012/0212804 A1* | 8/2012 | Sarkisyan | H01S 3/2325 359/347 |

(Continued)

FOREIGN PATENT DOCUMENTS

| | | |
|---|---|---|
| FR | 1049576 A | 12/1953 |
| WO | WO2019/042809 A1 | 3/2019 |

OTHER PUBLICATIONS

French Search Report from French Patent Office in counterpart French Application No. FR 20 05024 dated Feb. 1, 2021.

(Continued)

*Primary Examiner* — Hoon K Song
(74) *Attorney, Agent, or Firm* — ArentFox Schiff LLP

(57) ABSTRACT

The present invention relates to an optical system with a variable focal distance in a predetermined focal distance range, comprising two mirrors and a KB mechanical assembly having two supports adapted to support the mirrors one after the other along their main axis so as to form a propagation path.

The system is characterized in that each mirror has a useful portion whose width and/or thickness is/are variable and selected according to said predetermined distance range, and in that, for each mirror, it further comprises a deformation mechanism adapted to generate a curvature of the corresponding mirror along its length to adjust the focal distance within said predetermined distance range.

12 Claims, 8 Drawing Sheets

(56) References Cited

U.S. PATENT DOCUMENTS

2016/0270200 A1 9/2016 Hosler et al.

OTHER PUBLICATIONS

Khakurel, et al: "Generation of apodized X-ray illumination and its application to scanning and diffraction microscopy", Journal of Synchrotron Radiation, vol. 24, No. 1, pp. 142-149, Jan. 1, 2017.
Goto et al: "Size-changeable x-ray beam collimation using an adaptive x-ray optical system based on four deformable mirrors", Proceedings of SPIE; [Proceedings of SPIE ISSN 0277-786X vol. 10524], SPIE, US, vol. 9965, pp. 996502-996502, XP060080715, 8 Sep. 2016.

\* cited by examiner

OPTICAL SYSTEM WITH VARIABLE FOCAL DISTANCE AND OPTICAL ASSEMBLY COMPRISING SUCH A SYSTEM

CROSS-REFERENCE TO RELATED APPLICATION

This application claims priority to French Application No. 20 05024, filed on May 19, 2020. The disclosure of the priority application is incorporated in its entirety herein by reference.

FIELD OF THE INVENTION

The present invention relates to an optical system with variable focal distance.

The present invention also relates to an optical assembly comprising such a system.

The optical system according to the invention is applicable in many technical fields.

Among these fields, one may in particular mention the medical field, the crystallography field, the spectroscopy field, the imaging field, etc.

In all of these fields, the optical system according to the invention can be used in particular as portion of a more complex installation such as a condenser, a microscope, or a telescope.

In general, the invention remains applicable in any installation where it is necessary to point radiation particularly precisely.

The radiation may be of different natures.

In particular, this electromagnetic radiation may be X-rays, gamma rays or extreme ultraviolet rays (also called EUV rays).

BACKGROUND OF THE INVENTION

In the above-mentioned applications, optical systems are known to be used in which radiation is directed towards a target by a set of mirrors at grazing angles.

Grazing angles, also known by the English term of "grazing incidence", generally have angles lower than a few degrees, in particular lower than 2° or 1°, thus allowing the set of mirrors to concentrate the corresponding radiation on a target, which can be mobile or fixed.

For this, the state of the art proposes many optical systems for ensuring the desired accuracy.

Among these systems, the KB (Kirkpatrick-Baez, abbreviated) type of system in particular is known, in which two mirrors are arranged one after the other at different angles on an installation provided for this purpose, in order to send the radiation to the desired focus point. Each mirror focuses the beam in one of its dimensions.

A KB type optical system can be used in microscopes in particular working with high energy rays (X-rays, EUV or gamma rays).

In this case, the mirrors installed in such a system allow the high energy rays to be reflected and concentrated at the focus point after reflection at grazing incidence.

In this application, the adjustment of the focus point allows the zoom function of such a microscope to be made.

Thus, it is conceivable that the ability to adjust the focus point in a KB-type system presents a significant problem.

In the state of the art, among the known KB installations, there are systems in which the mirrors have fixed curvatures, which can be either cylindrical, elliptical or flat.

However, in such a case, it is not possible to adjust the focus point finely in the beam's propagation direction, the only remaining possibility for adjustment being the possibility of physical displacement of the mirrors and/or the target, which cannot always be done precisely.

Among other KB installations, systems in which the mirrors are flexible are also known. However, these mirrors define only one curvature in which the focus point can be reached.

This requires a very high degree of precision when bending these mirrors. In addition, it is sometimes necessary to bend the mirrors very significantly which can lead to breaking them.

Among other KB installations, systems in which the mirrors have a large number of actuators are also known. These actuators can be mechanical or electrical.

However, the latter system is very complex with many adjustment parameters which cannot always be done easily.

SUMMARY OF THE INVENTION

The aim of the present invention is to provide a variable focal distance optical system with a very simple structure and enabling the focal distance to be adjusted within a predetermined focal distance range.

To this end, it is an object of the invention to provide an optical system with variable focal distance within a predetermined focal distance range, comprising:

two mirrors, each mirror defining a reflecting surface and having a length extending along a main axis, a thickness extending substantially perpendicular to the main axis and to the reflecting surface, and a width extending substantially perpendicular to the length and the thickness;

a KB mechanical system comprising two supports adapted to support the mirrors one after the other along their main axis so as to form a propagation path of the same incident radiation at a grazing angle to the reflecting surface of each of the mirrors.

The system is characterized in that each mirror has a useful portion whose width and/or thickness is (are) variable and selected according to said predetermined distance range, and in that, for each mirror, it further comprises a deformation mechanism adapted to generate a curvature of the corresponding mirror along its length in order to adjust the focal distance within said predetermined distance range.

According to other advantageous aspects of the invention, the system comprises one or more of the following features taken alone or in any technically possible combination:

each mirror further has two attachment ends arranged on either side of the useful portion;

each deformation mechanism being adapted to generate a bending moment on each attachment end of the corresponding mirror;

each deformation mechanism comprises a single actuator adapted to generate substantially the same bending moment on each attachment end of the corresponding mirror;

each deformation mechanism comprises two actuators, each actuator being adapted to generate a bending moment on at least one of the attachment ends of the corresponding mirror;

each actuator is adapted to generate a bending moment on the corresponding attachment end or ends:

by exerting a force along the corresponding main axis on at least one portion of the support having an "I" profile; or by exerting a force along an axis perpendicular to the corresponding main axis on at least one portion of the support having an "L" profile;

the width of the useful portion of each mirror is selected as follows:

variable and non-linearly decreasing according to the direction of propagation of the radiation for a predetermined distance range, each focal distance of which is greater than or equal to the length of the corresponding mirror and less than or equal to a predetermined threshold, said threshold being ten times greater than the length of the corresponding mirror;

variable and non-linearly increasing and then decreasing according to the direction of propagation of the radiation for a predetermined distance range of which each focal distance is less than the length of the mirror for at least some of the predetermined focal distance ranges, each mirror has an initial curvature;

the curvature generated by the deformation mechanism has an elliptical shape;

each support of the KB installation is supported on a positioning mechanism adapted to generate a translational movement of said support along at least one axis and/or a rotational movement of said support around at least one axis;

each support of the KB installation is substantially immobile.

a control module adapted to control the operation of the deformation mechanism of each mirror according to a predetermined configuration.

The present invention also relates to an optical assembly as previously described and at least two mirrors interchangeable with the mirrors of said optical system to modify the predetermined focal distance range of said system.

BRIEF DESCRIPTION OF THE DRAWINGS

These features and advantages of the invention will become apparent from the following description, given only by way of example and not limiting, made with reference to the appended drawings in which.

DETAILED DESCRIPTION OF THE INVENTION

Figure 1:
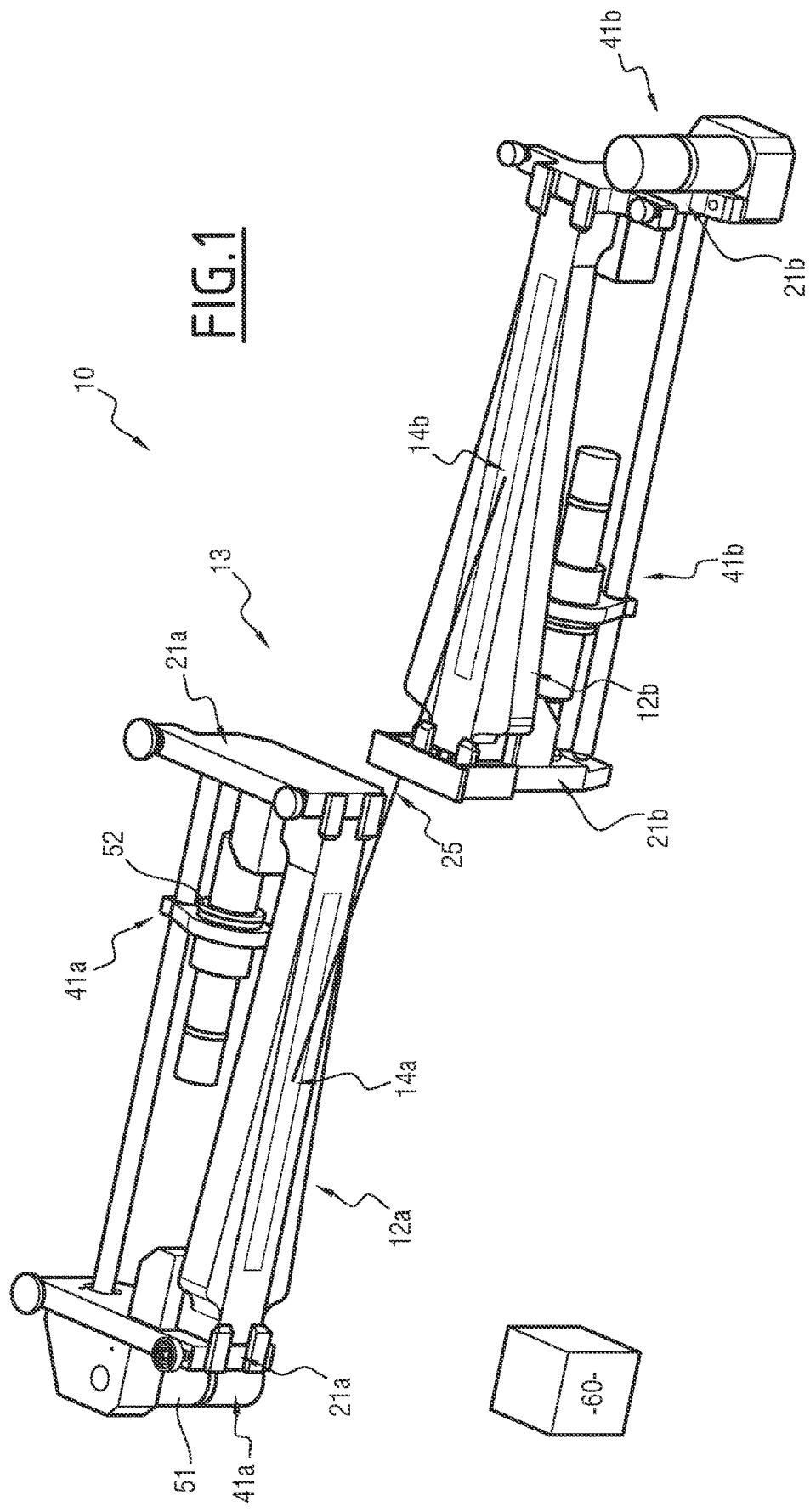
FIG. 1 is a schematic perspective view of an optical system according to a first embodiment of the invention, the optical system comprising two mirrors in particular.

FIG. 1 illustrates in effect an optical system 10 according to a first embodiment of the invention.

This optical system 10 enables concentrating radiation coming from a source (not visible on FIG. 1) on a target (not visible on FIG. 1) arranged in a focal plane of this system.

In addition, according to the invention, the system 10 enables the focal distance to be adjusted to the target, as will be explained later.

Radiation means any electromagnetic radiation of any spectrum depending on the nature of application of the optical system 10.

By way of example, in the following description, this radiation considered will be X-ray radiation.

However, the invention remains applicable to other types of radiation, including light radiation, gamma radiation or extreme ultraviolet radiation.

As can be seen in FIG. 1, the optical system 10 according to the invention comprises two mirrors 12a and 12b, hereinafter referred to as first mirror 12a and second mirror 12b, respectively, and a KB mechanical assembly 13.

Each of the mirrors 12a, 12b has a reflecting surface 14a, 14b respectively adapted to reflect the corresponding radiation.

The KB installation 13, also known as a Kirkpatrick-Baez system, is known per se.

Figure 2:
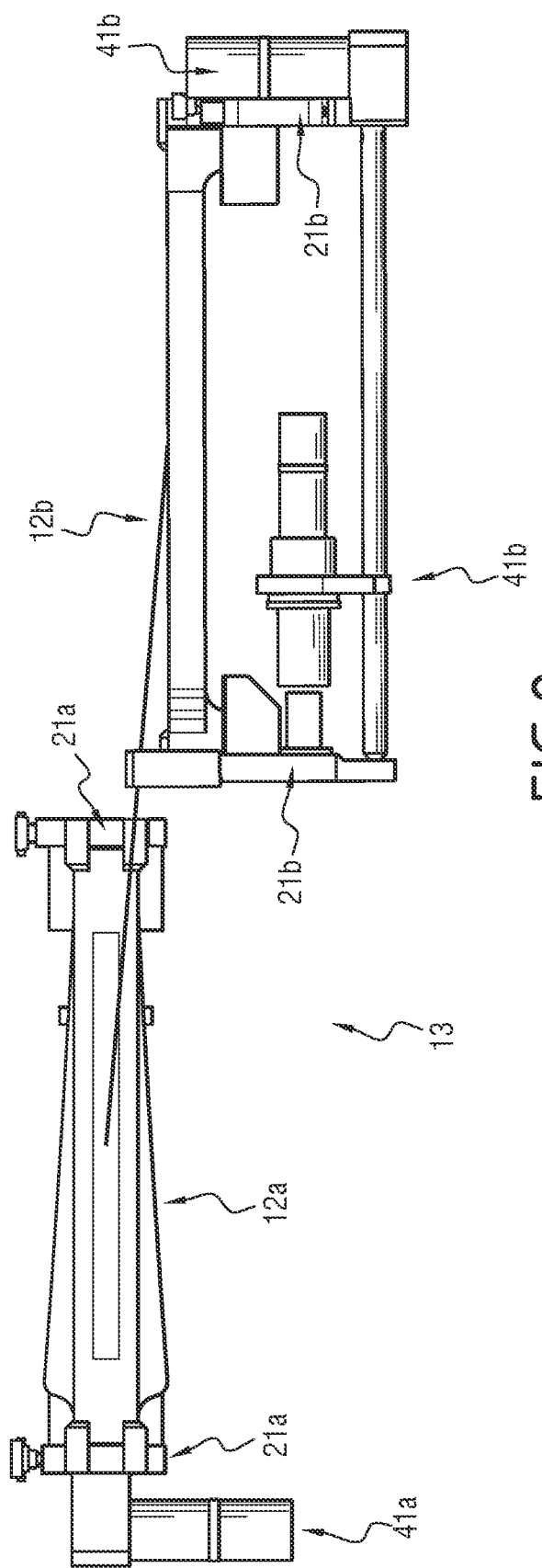
FIG. 2 is a side view of the optical system of FIG. 1.

In particular, such an KB installation 13 comprises two supports 21a, 21b visible in particular on FIG. 2.

Thus, as can be seen on this FIG. 2, the support 21a enables support of the first mirror 12a and the support 21b enables support of the second mirror 12b.

More particularly, in the example of FIGS. 1 and 2, each support 21a, 21b comprises two portions arranged on each end of the corresponding mirror 12a, 12b. Each of these portions is in the form of a plate, for example, with fixing means adapted to fix the corresponding end of the corresponding mirror 12a, 12b. Each plate is arranged, for example, substantially perpendicular to the corresponding reflecting surface 14a, 14b.

The supports 21a, 21b are adapted to support the mirrors 12a, 12b one after the other to form a propagation path for radiation coming from the source to the target at a grazing angle brackets relative to the reflective surface 14a, 14b of each such mirror 12a, 12b.

Such a propagation path is designated by the reference 25 and is particularly visible in FIG. 1. In the example of FIGS. 1 and 2, the propagation path 25 is formed from left to right. In other words, the direction of radiation propagation in the example of these Figures is from left to right.

Grazing angle means an angle relative to the corresponding reflective surface of less than a few degrees, for example less than 2° or less than 1°.

In the example shown in FIG. 1, the supports 21a, 21b of the KB installation 13 are perpendicular to each other such that the reflective surface 14a of the first mirror 12a is rotated relative to the reflective surface 14b of the second mirror 12b substantially at 90°.

In a particular example of the invention, both supports 21a, 21b are fixed. Thus, according to this example, the mirrors 12a, 12b are located integrally in the KB installation 13.

According to another example embodiment, at least one of the supports, advantageously both supports 21a, 21b, are movable.

In particular, in such an example embodiment, one of these supports or each of these supports 21a, 21b is supported on a positioning mechanism (not shown in FIGS. 1 and 2).

This positioning mechanism makes it possible, for example, to generate a translational movement of the corresponding support 21a, 21b along at least one axis and/or a rotational movement of this support about at least one axis.

Advantageously, according to the invention, each positioning mechanism makes it possible to generate a translational movement of the corresponding support along three axes and a rotational movement of this support around three axes.

Thus, in this example, each of the supports 21a, 21b is supported on a positioning mechanism with six degrees of latitude.

The two mirrors 12a, 12b are for example substantially identical.

Thus, in the following, only the mirror 12a will be described in detail, particularly with reference to FIG. 3.

As can be seen in this FIG. 3, this mirror 12a has an elongated shape along a main axis, hereinafter denoted as the X axis. The length L of this mirror 12a is defined along the main axis X.

Figure 3:
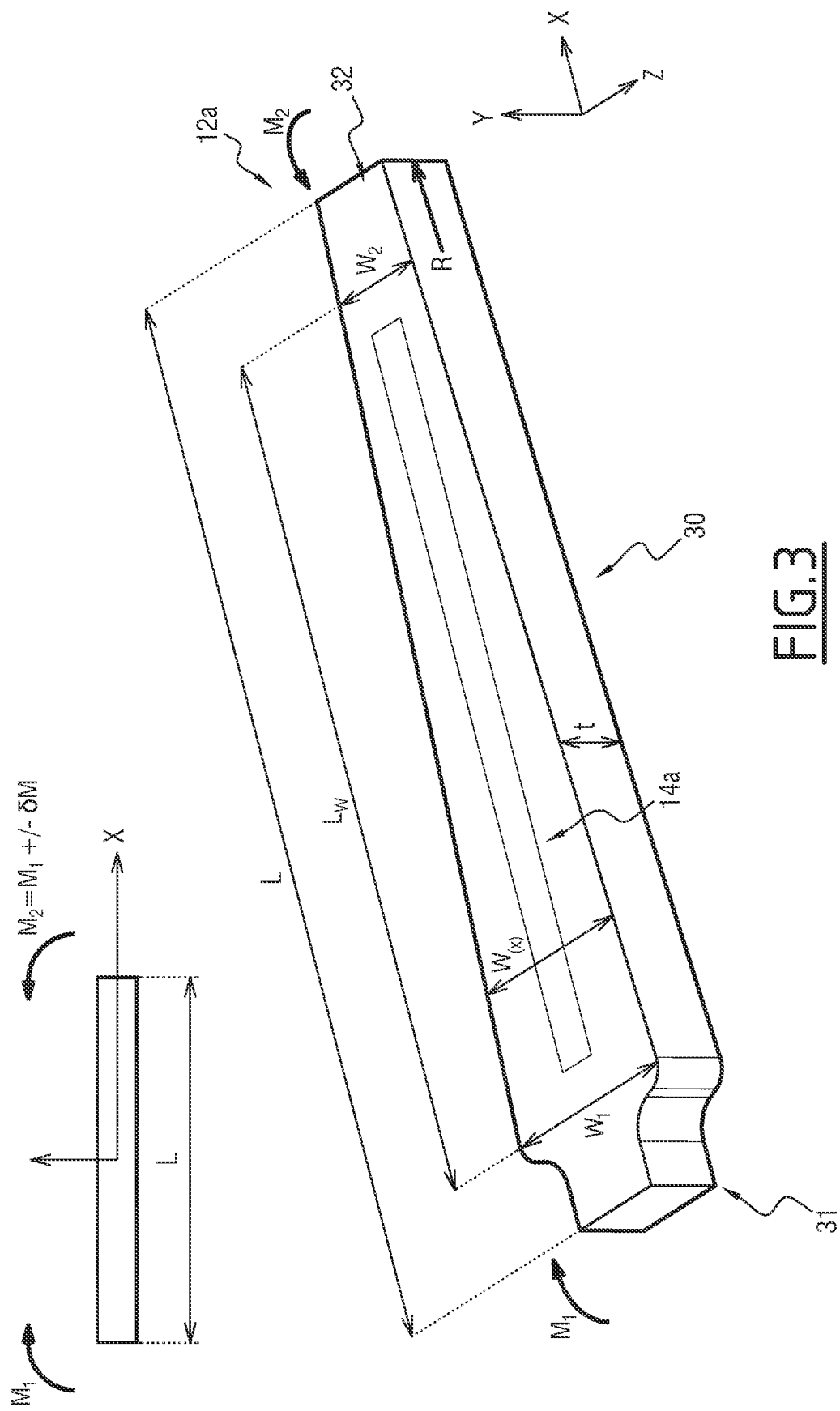
FIG. 3 is a schematic perspective side view of one of the mirrors of the optical system of FIG. 1.

Two other axes perpendicular to the principal axis X are also defined in the example of this FIG. 3. In particular, the width $W_{(x)}$ of the mirror 12a extends along the axis Z and its thickness t extends along the axis Y.

Furthermore, as can also be seen in FIG. 3, the direction of the principal axis X corresponds substantially to the direction of propagation R of the radiation.

The thickness t of the mirror 12a is for example substantially constant. According to another embodiment (not explained in detail), the thickness $t_{(x)}$ varies along the main axis X according to the same law $W_{(x)}$ as the width, as explained below. In this case, the width of the mirror is for example substantially constant.

In the example shown, the mirror 12a has a useful portion 30, and first and second attachment ends 31, 32 placed on opposite sides of the useful portion 30.

The useful portion 30 is operable to reflect radiation while the attachment ends 31, 32 are operable to secure and/or flex the mirror 12 a as will be explained later.

The length of the useful portion 30, denoted in FIG. 3 by the reference $L_w$, is therefore less than the length L of the mirror 12a.

According to the invention, the width $W_{(x)}$ including the useful portion 30 is selected according to a predetermined range of focal distances for which the optical system 10 is usable.

In particular, according to the first example embodiment, the optical system 10 is operable for a predetermined focal distance range in which each focal distance is greater than the mirror length L and less than or equal to a predetermined threshold.

This predetermined threshold is, for example, between one and ten times greater, advantageously fifteen times greater and even more advantageously twenty times greater than the mirror length L.

In other words, this focal distance range comprises focal distances greater than the length L of the mirror 12a but not "much greater" than this length. The notion of "much greater" can be easily defined by the person skilled in the art according to each concrete application of the optical system 10. This notion is further characterized above by said predetermined threshold.

For this range of focal distances, the width W(x) of the useful portion 30 of the mirror 12a is variable and is non-linearly decreasing along the direction of radiation propagation or, in other words, along the principal axis X.

The width W(x) of the useful portion 30 is thus a function of the x-coordinate of the principal axis X. This function W(x) can be approximated by a polynomial whose smallest order is one. In other words:

$$W(x) \sim \sum_{n \geq 0} a_n x^{2n+1}$$

In such a case, the width $W_1$ of the end of the useful portion 30 adjacent to the first attachment end 31 is thus greater than the width $W_2$ of the end of the useful portion 30 adjacent to the second attachment end 32.

Finally, this function W(x) is selected such that the reflective surface 14a has symmetry with respect to the principal axis X.

According to the invention, in order to then adjust the focal distance within the predetermined focal distance range by the width W(x) of the mirrors 12a, 12b, the optical system 10 further comprises a deformation mechanism 41a, 41b for each of the mirrors 12a, 12b.

These deformation mechanisms 41a, 41b are particularly visible in FIGS. 1 and 2 and make it possible to generate a curvature of the corresponding mirror 12a, 12b according to the length of this mirror 12a, 12b. Advantageously, the curvature generated by these mechanisms is elliptical.

To do this, each of the deformation mechanisms 41a, 41b is adapted to generate a bending moment on each end 31, 32 of the corresponding mirror 12a, 12b.

Like the mirrors 12a, 12b, these deformation mechanisms 41a, 41b are, for example, substantially similar.

Thus, in the following, only the deformation mechanism 41a will be described in more detail with particular reference to FIG. 4.

With reference to this Figure as well as to FIG. 1, according to the first embodiment of the invention, the deformation mechanism 41a comprises a main actuator 51 and an auxiliary actuator 52.

These actuators 51, 52 are associated with the attachment ends 31, 32 of the mirror 12a and make it possible to generate a bending moment, $M_1$, $M_2$ on each end 31, 32 respectively.

Figure 4:
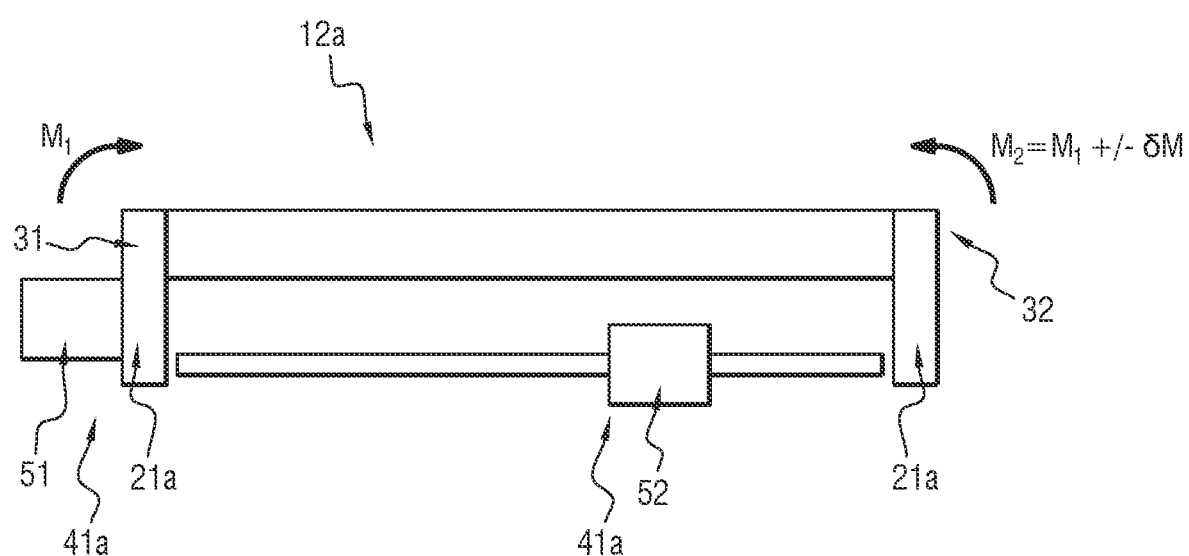
FIG. 4 is a schematic view of a deformation mechanism that can be used to bend the mirror of FIG. 3.

To do this, in the example of FIGS. 1, 2 and 4, the main actuator 51 is adapted to exert a force on the portion of the support 21a associated with the end 31 of the mirror 12a. In particular, when this portion of the support 21a is in the form of a plate, i.e., when it has an "I" profile, the actuator 51 is adapted to exert a force on this plate in order to curve the mirror 12a.

The auxiliary actuator 52 is adapted to exert a force along the main axis X on each portion of the support 21a in order to correct the curvature of the mirror 12a generated by the main actuator 51.

In particular, when each portion of the support 21a is in the form of a plate, the auxiliary actuator 52 is adapted to move away from each other the ends of the plates opposite the ends fixing the mirror 12a.

Furthermore, as can be seen in FIG. 4, the auxiliary actuator 52 is arranged along the main axis asymmetrically with respect to the center of the mirror 12a.

Thus arranged, the actuators 51, 52 are adapted to generate bending moments $M_1$, $M_2$ slightly different from each other.

In the example shown in FIG. 4, the bending moment $M_2$ is equal to the moment $M_1$ plus or minus OM, where OM is a small value relative to the value $M_1$.

According to an advantageous example of the first embodiment of the invention, each mirror 12a, 12b has a preformed initial curvature. This curvature is given by the initial shape of the mirror substrate. The shape of this curvature corresponds, for example, to the shape of an ellipse corresponding to the largest radius of curvature achieved by the corresponding deformation mechanisms 41a, 41b.

Furthermore, according to an advantageous example of the invention, the optical system 10 comprises a control module 60.

This control module 60 makes it possible to simultaneously control the deformation mechanisms 41a, 41b and, optionally, the positioning mechanisms of the supports 21a, 21b of the KB installation 13, in order to automatically adjust the focal distance.

For this purpose, the control module 60 comprises, for example, a table of correspondence between different focal distances and curvature parameters and possibly the positions of the mirrors 12a, 12b.

This control module 60 can, for example, be operated by a single command from a user and thereby has an autofocus function of the system 10.

An optical system according to a second embodiment will now be explained with reference to FIGS. 5 and 6.

In particular, the optical system according to this embodiment is substantially identical to the previously explained optical system 10 and in particular comprises the same KB installation, which will therefore not be described in detail hereafter.

The only difference in the optical system according to the second embodiment consists in the shape of the mirrors 12a, 12b that can be used in the KB installation 13.

Thus, as in the previous case, the optical system according to the second embodiment comprises two substantially identical mirrors 112, only one of which will be explained with reference to FIGS. 5 and 6.

Figure 5:
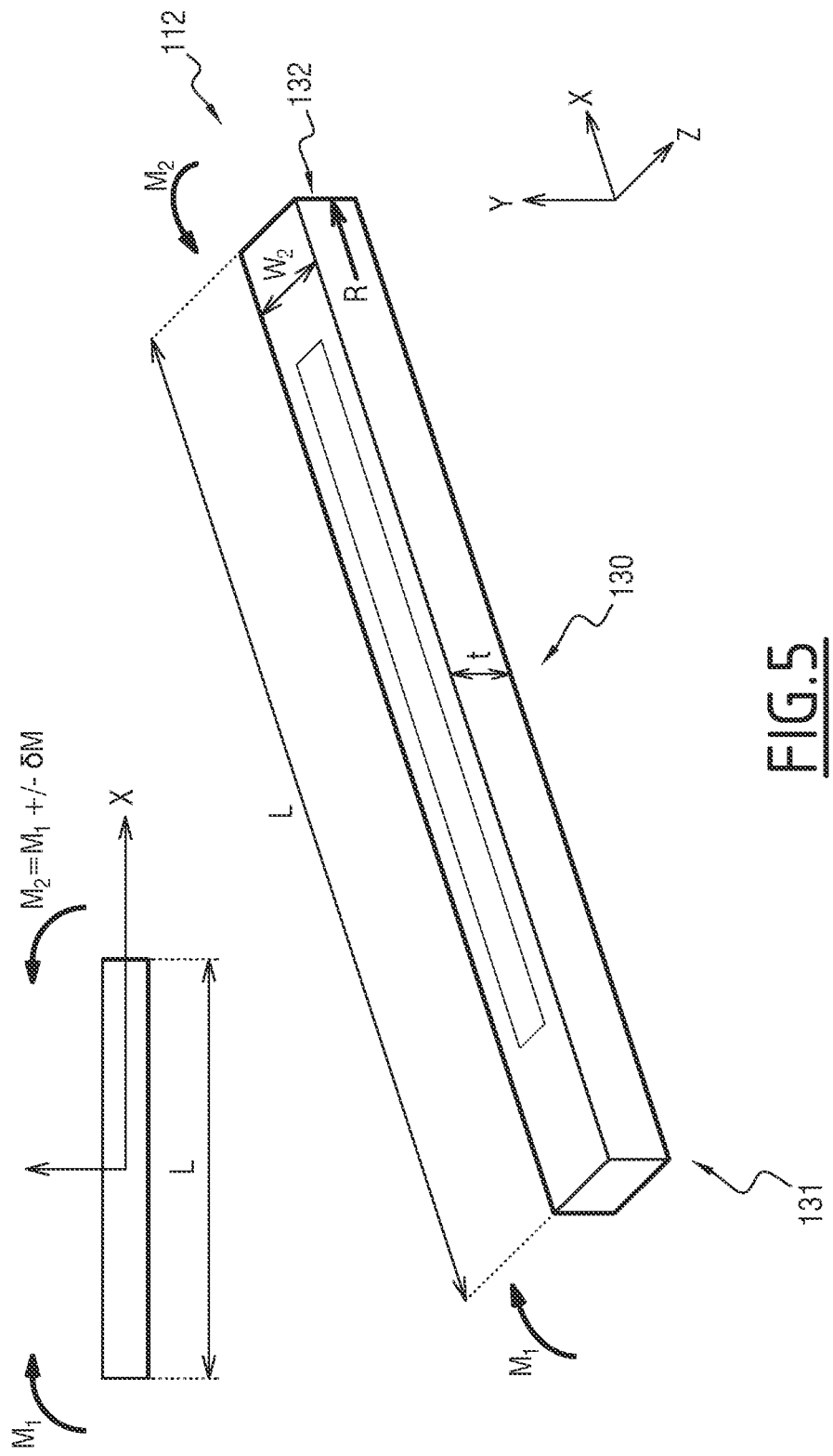
FIG. 5 is a schematic perspective and side view of a mirror usable in an optical system according to a second embodiment of the invention.

As in the previous case, the mirror 112 of FIG. 5 is elongated along the main axis X. Its length L is defined along this X axis and its width and thickness are defined along the Z and Y axes respectively, perpendicular to the X axis.

The mirror 112 also has a main portion 130 and two ends 131, 132 arranged on either side of this main portion 130.

Unlike the previous embodiment, the useful portion 130 of this mirror 112 has a substantially constant width W.

According to a first example of this embodiment, the mirror 112 also has a constant thickness t. In this case, the optical system is operated within a predetermined range of focal distances, each focal distance of which is greater than or equal to the predetermined threshold defined in connection with the first embodiment. The predetermined threshold is, for example, ten times greater, advantageously fifteen times greater or even more advantageously twenty times greater than the length L of the mirror 112. This means that the mirror 112 according to the second embodiment of the invention allows for focal distances much greater than the length of the mirror L.

According to a second example of this second embodiment, the mirror 112 has a varying thickness t(x) along the principal axis X. The law of this variation is, for example, the same as the law of variation of the width W(x) explained in connection with the first or second embodiment. In this case, the predetermined focal distance range in which the optical system is operable depends on this law.

Furthermore, the mirror 112 may initially have a substantially flat shape in the XY plane or curved as explained in connection with the first or second embodiment.

As in the previous case, a deformation mechanism 141 is associated with the mirror 112 to adjust the focal distance of the optical system within the predetermined range.

Figure 6:
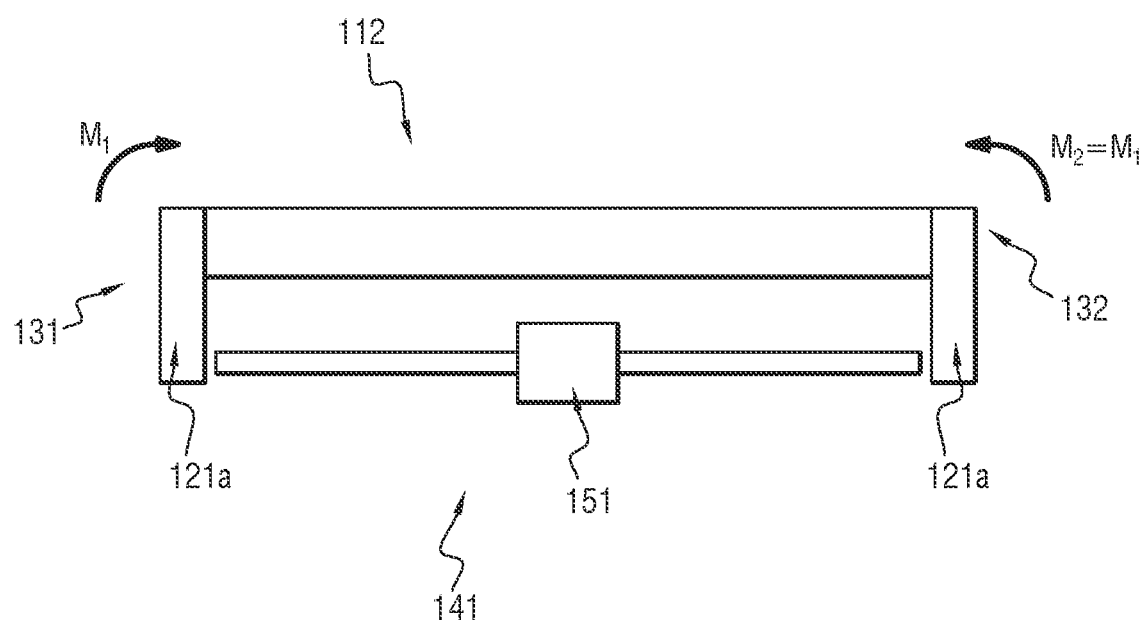
FIG. 6 is a schematic view of a deformation mechanism for bending the mirror of FIG. 5.

This deformation mechanism 141, visible in FIG. 6, is then adapted to generate an elliptical-shaped curvature of the mirror 112 by generating a bending moment on each attachment end 131, 132 of this mirror 112.

According to this embodiment, this deformation mechanism 141 has, for example, a single actuator 151 which is then adapted to exerting a force in both directions of the main axis X to generate the same bending moment $M_1$, $M_2$ on each of these ends 131, 132.

As also in the previous case, this force is exerted on each portion of the support 121a on each end 131, 132 of the mirror 112.

Alternatively, the deformation mechanism 141 has two actuators, as in the previous case.

An optical system according to a third embodiment of the invention will now be explained with reference to FIGS. 7 and 8.

As in the previous case of the second embodiment, the optical system according to the third embodiment comprises the same KB installation 13 which will not be described hereafter.

The difference of this optical system according to the third embodiment is the shape of the mirrors usable with the KB 13 installation as well as the associated deformation mechanism.

Also as in the previous cases, this optical system according to the third embodiment comprises two substantially identical mirrors 212 of which only one will be described hereafter with reference to the Figures.

Figure 7:
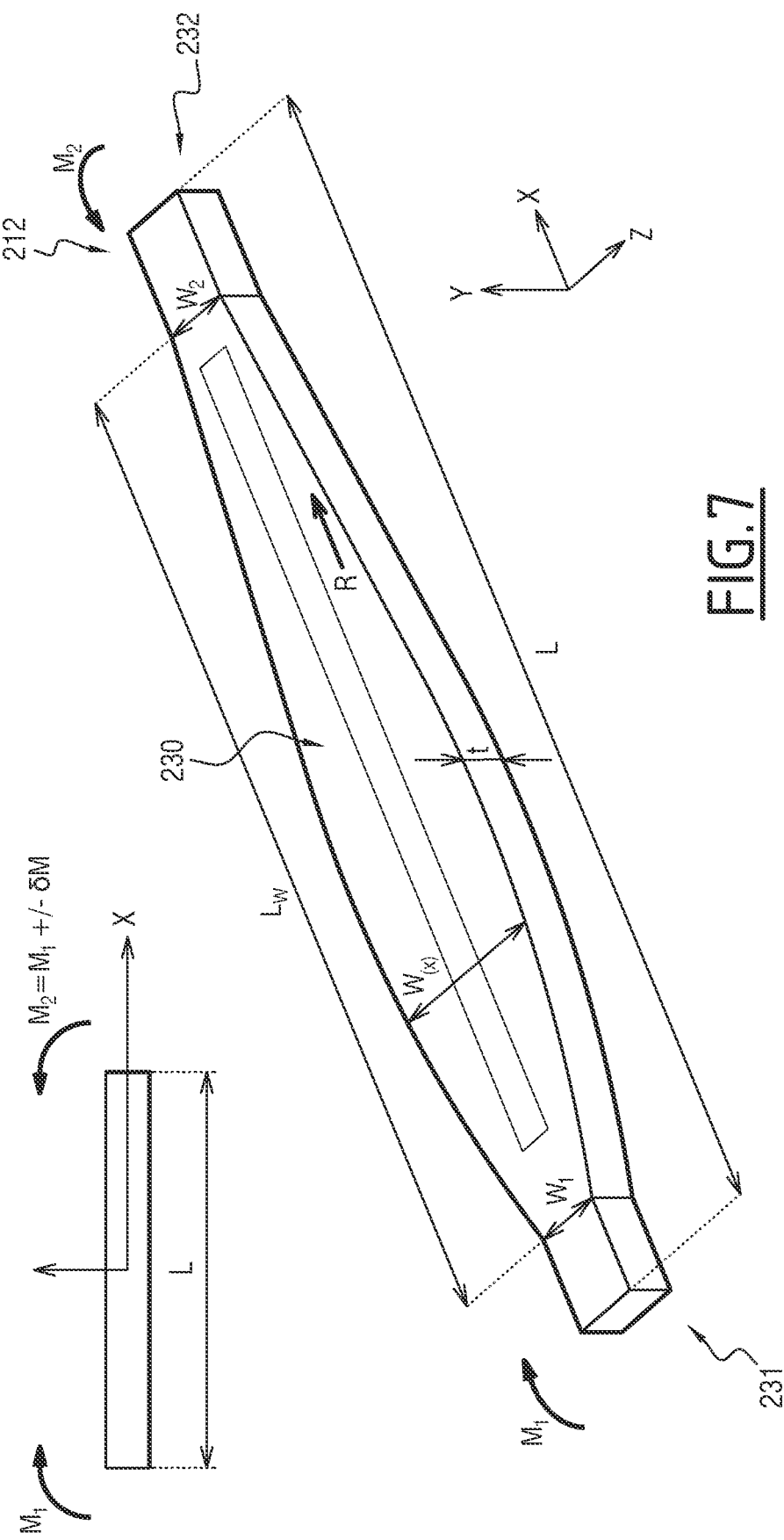
FIG. 7 is a schematic perspective and side view of a mirror for use in an optical system according to a third embodiment of the invention.
Figure 8:
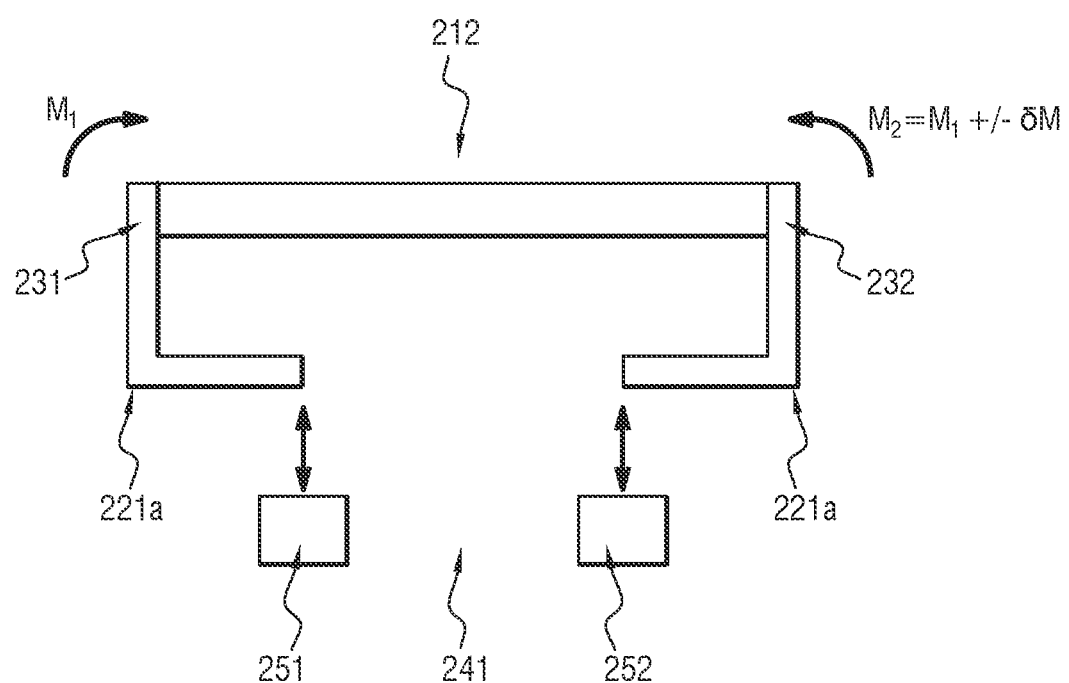
FIG. 8 is a schematic view of a deformation mechanism for bending the mirror of FIG. 7.

As illustrated in FIG. 7, as in the first embodiment, the mirror 212 is of length L and its main portion 230 has a variable width W(x) along the main axis X. The thickness t of this mirror 212 is for example substantially constant.

In particular, this width W(x) is variable non-linearly in an increasing and then decreasing manner according to the direction of propagation of the radiation, i.e., according to the direction of the principal axis X.

The width W(x) thus has a function of the x-coordinate of the X-axis that can be approximated in this case by a polynomial whose smallest order is equal to two. In other words:

$$W(x) \sim \sum_{n \geq 1} a_n x^{2n}$$

Thus, in this case, the width $W_1$ of the end of the main portion 230 adjacent to the first attachment end 231 is substantially equal to the width $W_2$ of the end of the main portion 230 adjacent to the second end 232 of this mirror 212.

With a width W(x) thus selected for the mirrors 212, the optical system according to the third embodiment is operable to adjust the focal distance within a predetermined range of focal distances, each focal distance of which is between L/2 and the mirror length L.

Finally, as in the previous cases, a deformation mechanism 241 is associated with the mirror 212. This deformation mechanism 241 is adapted to generate an elliptical curvature of the mirror 212 along its length to adjust the focal distance within said range, by applying a bending moment $M_1$, $M_2$ respectively to each of the ends 231, 232 of this mirror.

According to this embodiment, the bending moment $M_1$ is significantly different from the bending moment $M_2$.

For example, this bending moment $M_1$ is substantially less than the bending moment $M_2$.

To generate such moments, the deformation mechanism 241 takes the form of two actuators 251, 252 which are then configured to exert a force along the Y axis on each portion of the support 221a. In this case, each portion of the support 221a has an "L"-shaped profile as can be seen in FIG. 8.

Finally, as in the first embodiment, the mirror 212 has an initial curvature that has an elliptical shape whose radius is selected as an arithmetic average between the radius of curvature corresponding to the minimum focal distance and that of the maximum focal distance.

It is then conceivable that the present invention has a number of advantages.

First, the optical system according to the invention makes it possible to ensure an adjustment of the focal distance within a predetermined range of focal distances.

This adjustment is performed by the elliptical deformations of the corresponding mirrors.

Moreover, the shape and in particular the width of these mirrors defines the range of these distances.

Thus, the optical system according to the invention has a simple structure that is relatively insensitive to manufacturing inaccuracies.

Furthermore, the person skilled in the art will understand that the features described with reference to the various embodiments, mentioned below, can be combined with each other, in particular to achieve different ranges of focal distances for the optical system.

It is also possible to design an optical assembly comprising an optical system as described below and one or more pairs of interchangeable mirrors. Thus, to change the predetermined focal distance range of such an optical system, only the mirrors need to be change. For example, it is possible to design such an assembly with a pair of mirrors conforming to each of the embodiments described above.

The invention claimed is:

1. An optical system with variable focal distance within a predetermined focal distance range, comprising:
    two mirrors, each mirror defining a reflective surface and having a length extending along a major axis, a thickness extending substantially perpendicular to the major axis and the reflective surface, and a width extending substantially perpendicular to the length and thickness;
    a KB mechanical assembly comprising two supports adapted to support the mirrors one after the other along their principal axis so as to form a propagation path of the same incident radiation at a grazing angle with respect to the reflecting surface of each of the mirrors;
    wherein each mirror has a useful portion whose width and/or thickness is (are) variable and selected according to the said predetermined distance range, and wherein, for each mirror, the system further comprises a deformation mechanism adapted to generate a curvature of the corresponding mirror along its length to adjust the focal distance within said predetermined distance range.

2. The system according to claim 1, wherein each mirror further has two attachment ends arranged on either side of the useful portion;
    each deformation mechanism being adapted to generate a bending moment on each attachment end of the corresponding mirror.

3. The system according to claim 2, wherein each deformation mechanism comprises a single actuator adapted to generate substantially the same bending moment on each attachment end of the corresponding mirror.

4. The system according to claim 2, wherein each deformation mechanism two actuators, each actuator being adapted to generate a bending moment on at least one of the attachment ends of the corresponding mirror.

5. The system according to claim 4, wherein each actuator is adapted to generate a bending moment on the corresponding attachment end or ends:
    by exerting a force along the corresponding principal axis on at least a portion of the support having an "I" profile; or
    by exerting a force along an axis perpendicular to the corresponding principal axis on at least one portion of the support having an "L" profile.

6. The system according to claim 1, wherein the width of the useful portion of each mirror is selected as follows:
    variable and non-linearly decreasing according to the direction of propagation of the radiation for a predetermined distance range, each focal distance of which is greater than or equal to the length of the corresponding mirror and less than or equal to a predetermined threshold, said threshold being ten times greater than the length of the corresponding mirror;
    variable and non-linearly increasing and then decreasing along the direction of propagation of the radiation for a predetermined distance range each focal distance of which is less than the length of the mirror.

7. The system according to claim 1, wherein for at least some of the predetermined focal distance ranges, each mirror has an initial curvature.

8. The system according to claim 1, wherein the curvature generated by the deformation mechanism has an elliptical shape.

9. The system according to claim 1, wherein each support of the KB installation is supported on a positioning mechanism adapted to generate a translational movement of said support along at least one axis and/or a rotational movement of said support about at least one axis.

10. The system according to claim 1, wherein each support of the KB installation is substantially stationary.

11. The system according to claim 1, further comprising a control module adapted to control the operation of the deformation mechanism of each mirror according to a predetermined configuration.

12. An optical assembly comprising:
    an optical system according to claim 1;
    at least two mirrors interchangeable with the mirrors of said optical system to change the predetermined focal distance range of said system.

* * * * *